(12) United States Patent
Shiota et al.

(10) Patent No.: US 9,287,201 B2
(45) Date of Patent: Mar. 15, 2016

(54) SEMICONDUCTOR DEVICE

(75) Inventors: Hiroki Shiota, Tokyo (JP); Seiji Oka, Tokyo (JP); Yoshihiro Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 136 days.

(21) Appl. No.: 13/988,535

(22) PCT Filed: Dec. 5, 2011

(86) PCT No.: PCT/JP2011/078056
§ 371 (c)(1),
(2), (4) Date: May 21, 2013

(87) PCT Pub. No.: WO2012/081434
PCT Pub. Date: Jun. 21, 2012

(65) Prior Publication Data
US 2013/0240912 A1   Sep. 19, 2013

(30) Foreign Application Priority Data
Dec. 16, 2010   (JP) .................. 2010-280430

(51) Int. Cl.
*H01L 23/495* (2006.01)
*H01L 23/36* (2006.01)
(Continued)

(52) U.S. Cl.
CPC .......... *H01L 23/49568* (2013.01); *H01L 23/36* (2013.01); *H01L 29/1602* (2013.01); *H01L 29/1608* (2013.01); *H01L 23/3121* (2013.01); *H01L 24/32* (2013.01); *H01L 24/48* (2013.01); *H01L 24/73* (2013.01); *H01L 25/0655* (2013.01); *H01L 25/072* (2013.01);
(Continued)

(58) Field of Classification Search
CPC ............ H01L 23/3675; H01L 23/3677; H01L 23/49568; H01L 23/34
See application file for complete search history.

(56) References Cited

U.S. PATENT DOCUMENTS

2001/0040006 A1* 11/2001 Pompeo et al. ............. 156/307.1
2002/0050585 A1*  5/2002 Masayuki et al. ............. 252/500
(Continued)

FOREIGN PATENT DOCUMENTS

| JP | 01-259595 | 10/1989 |
|---|---|---|
| JP | 2003 137627 | 5/2003 |

(Continued)

OTHER PUBLICATIONS

Office Action issued on Feb. 12, 2014, in Japanese Patent Application No. 2012-548739 with partial English translation.
(Continued)

*Primary Examiner* — Tucker J Wright
(74) *Attorney, Agent, or Firm* — Oblon, McClelland, Maier & Neustadt, L.L.P.

(57) ABSTRACT

A semiconductor device including: a semiconductor element; a lead frame connected to the semiconductor element; a metal base plate mounted on the lead frame via a first insulation layer; and a second insulation layer disposed on the opposite side of the metal base plate face on which the first insulation layer is disposed; wherein the first insulation layer is an insulation layer whose heat-dissipation performance is higher than that of the second insulation layer, and the second insulation layer is an insulation layer whose insulation performance is the same as that of the first insulation layer or higher than that of the first insulation layer.

14 Claims, 3 Drawing Sheets

(51) Int. Cl.
  *H01L 29/16* (2006.01)
  *H01L 23/00* (2006.01)
  *H01L 25/065* (2006.01)
  *H01L 25/07* (2006.01)
  *H01L 23/31* (2006.01)

(52) U.S. Cl.
  CPC .......... *H01L 2224/32013* (2013.01); *H01L 2224/32245* (2013.01); *H01L 2224/48091* (2013.01); *H01L 2224/48137* (2013.01); *H01L 2224/73265* (2013.01); *H01L 2924/1033* (2013.01); *H01L 2924/10253* (2013.01); *H01L 2924/10272* (2013.01); *H01L 2924/1203* (2013.01); *H01L 2924/1305* (2013.01); *H01L 2924/13055* (2013.01); *H01L 2924/14* (2013.01)

(56) References Cited

U.S. PATENT DOCUMENTS

| | | | |
|---|---|---|---|
| 2002/0109211 A1* | 8/2002 | Shinohara | 257/666 |
| 2004/0124526 A1* | 7/2004 | Matayabas et al. | 257/712 |
| 2004/0130018 A1* | 7/2004 | Sugiyama et al. | 257/706 |
| 2005/0224955 A1* | 10/2005 | Desai et al. | 257/706 |
| 2006/0038281 A1* | 2/2006 | Colgan et al. | 257/706 |
| 2007/0205503 A1* | 9/2007 | Baek et al. | 257/712 |
| 2007/0240899 A1 | 10/2007 | Sakamoto et al. | |
| 2008/0014430 A1 | 1/2008 | Onoue et al. | |
| 2009/0108429 A1* | 4/2009 | Tsao et al. | 257/686 |
| 2009/0267215 A1* | 10/2009 | Kitahara et al. | 257/691 |
| 2010/0013085 A1* | 1/2010 | Oi et al. | 257/693 |
| 2010/0013086 A1* | 1/2010 | Obiraki et al. | 257/693 |
| 2012/0025132 A1 | 2/2012 | Asahi et al. | |

FOREIGN PATENT DOCUMENTS

| | | |
|---|---|---|
| JP | 2006-65559 A | 3/2006 |
| JP | 2006 100750 | 4/2006 |
| JP | 2006-100759 A | 4/2006 |
| JP | 2006 303086 | 11/2006 |
| JP | 2008-69424 | 3/2008 |
| JP | 2009-010213 | 1/2009 |
| JP | 2010-157563 A | 7/2010 |
| JP | 2010-171030 A | 8/2010 |
| JP | 2010-171129 A | 8/2010 |
| JP | 2010-218688 A | 9/2010 |
| WO | WO 2010/098066 A1 | 9/2010 |

OTHER PUBLICATIONS

International Search Report Issued Mar. 6, 2012 in PCT/JP11/078056 Filed Dec. 5, 2011.

Office Action issued Jun. 24, 2014, in Japanese Patent Application No. 2012-548739 (with partial English-language translation).

Office Action issued Oct. 8, 2013 in Japanese Patent Application No. 2012-548739 (with partial English translation).

Office Action issued on Apr. 28, 2015 in Chinese Patent Application No. 201180058644.0 (with English Translation).

German Office Action issued Mar. 30, 2015 in German Patent Application No. 11 0211 104 406.2 with English translation.

* cited by examiner ized is 45 μm or less; an inorganic powder X consti-
SEMICONDUCTOR DEVICE

TECHNICAL FIELD

The present invention relates to semiconductor devices mounted with semiconductor elements such as IGBTs and diodes.

BACKGROUND ART

Until now, a semiconductor device mounted with semiconductor elements that generate heat attributable to their operation includes a metal base plate made of metal such as copper that excels in thermal conductivity, in order to enhance heat-dissipation performance. In a conventional semiconductor device, heat generated by semiconductor elements is dissipated through an organic insulation sheet and ceramic substrate to a metal base plate connected to a cooling unit. In recent years, the heat-dissipation characteristics need to be enhanced even more with growing high-density integration of the semiconductor elements.

A semiconductor device is disclosed in Patent document 1, in which a ceramic insulation substrate is disposed on a metal base plate via solder, and in addition on the ceramic insulation substrate are mounted semiconductor elements such as power chips via solder. Heat generated by the semiconductor elements is transmitted to the metal base plate via the ceramic substrate, and then dissipated outside through a cooling unit connected to the metal base plate. The ceramic substrate is made by sintering inorganic materials such as aluminum nitride (AlN), aluminum oxide ($Al_2O_3$) and silicon nitride (SiN), and its heat-dissipation performance is thereby enhanced.

When the organic insulation sheet is interposed between the semiconductor elements and metal base, the heat-dissipation performance of the organic insulation sheet needs to be enhanced. Inorganic powder with high thermal conductivity for enhancing the heat-dissipation performance is disclosed in, for example, Patent document 2. This inorganic powder with high thermal conductivity includes inorganic powder whose average particle size is 1 to 20 μm and maximum particle size is 45 μm or less; an inorganic powder X constituted of particles sized ranging from 3 to 40 μm is spherically-shaped with a roundness of 0.80 or more and in addition a thermal conductivity of 10 W/mK or more; an inorganic powder Y constituted of particles sized ranging from 0.1 to 1.5 μm is spherically- or aspherically-shaped with a roundness in a range from 0.30 to 0.80 and in addition a thermal conductivity being the same as or less than that of the powder X; and the mass ratio of X/Y is between 1 and 30. Thereby, a resin composition has been intended to be prepared, which is provided with excellent heat-dissipation performance, as well as the viscosity of which would not easily increase even if resin is densely filled with the powder.

PRIOR ART DOCUMENT

Patent Document

Patent document 1: Japanese Laid-open Patent Publication No. 2006-303086 (see FIG. 1)

Patent document 2: Japanese Laid-open Patent Publication No. 2003-137627 (see Paragraphs 0004-0006)

DISCLOSURE OF THE INVENTION

Problem to be Solved by the Invention

An organic insulation sheet and ceramic substrate applied to a semiconductor device need to be provided with not only heat-dissipation performance but also insulation performance in order to stably drive the semiconductor device. In particular, in recent years the semiconductor device is mounted with semiconductor elements, such as silicon carbide (SiC) elements, capable of dealing with high current and operating at high frequency, so it is required to deal with increasing heat generation and rated voltage of the elements and reduction in size of the semiconductor device. Therefore, the semiconductor device needs to be manufactured in which heat generated by the semiconductor elements can be efficiently dissipated to the metal base plate, without deteriorating the insulation reliability of the organic insulation sheet and ceramic substrate.

However, thermal conductivity required for enhancing the heat-dissipation performance and withstand voltage and partial discharge resistance required for enhancing the insulation performance are in a trade-off relationship; therefore, the particle size of the inorganic powder is restricted in, for example, Patent Document 2 whereby its filling amount is increased and the heat-dissipation performance is enhanced. However, electric field concentration by the inorganic filler in the proximity of the filler has not been taken into consideration, thereby raising a problem in that the insulation performance is deteriorated. Moreover, when a ceramic substrate is used as in Patent document 1 etc., high withstand voltage is achieved by thickening the ceramic substrate; however there has been another problem in that the thickening of the ceramic substrate, which becomes an insulation layer, increases thermal resistance, thereby deteriorating the heat-dissipation performance.

The present invention has been made to solve the foregoing problems, and aims at obtaining a semiconductor device in which both the heat-dissipation performance and insulation performance are enhanced.

Means for Solving the Problem

A semiconductor device according to the present invention comprises: a semiconductor element; a lead frame connected to the semiconductor element; a metal base plate mounted on the lead frame via a first insulation layer; and a second insulation layer disposed on the opposite side of the metal base plate face on which the first insulation layer is disposed. The first insulation layer is an insulation layer whose heat-dissipation performance is higher than that of the second insulation layer, and the second insulation layer is an insulation layer whose insulation performance is the same as that of the first insulation layer or higher than that of the first insulation layer.

Advantage of the Invention

According to the present invention, since two insulation layers are disposed on both sides of the metal base plate and those two insulation layers have characteristics different from each other, both the heat-dissipation performance and insulation performance can be enhanced.

BEST MODE FOR CARRYING OUT THE INVENTION

Embodiment 1

Figure 1:
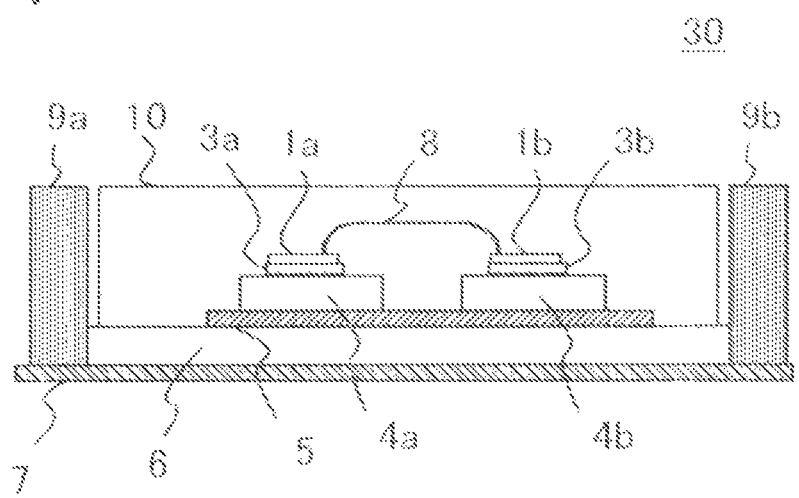
FIG. 1 is a cross-sectional view showing a semiconductor device according to Embodiment 1 of the present invention.

FIG. 1 is a cross-sectional view showing a semiconductor device according to Embodiment 1 of the present invention. The semiconductor device 30 shown in FIG. 1 is an example in which two semiconductor elements, 1a and 1b, are mounted. The semiconductor device 30 includes lead frames (conductive members) 4a and 4b on which the semiconductor elements 1a and 1b are mounted; cooling units 9a and 9b that dissipates heat generated by the semiconductor elements 1a and 1b; and a metal base plate 6 connected to the cooling units 9a and 9b. The semiconductor elements 1a and 1b are mounted on their respective lead frames 4a and 4b; the semiconductor element 1a is connected to the lead frame 4a and the semiconductor element 1b is connected to the lead frame 4b. The semiconductor elements 1a and 1b are soldered to the lead frames 4a and 4b with solder 3a and 3b, respectively. The semiconductor elements 1a and 1b are electrically connected with each other by a wire 8. Moreover, the semiconductor elements 1a and 1b are electrically connected by wires (not shown) to external terminals (not shown). An insulation layer 5 with high heat-dissipation performance (hereinafter occasionally referred to as a high-heat-dissipation insulation layer) is interposed between the lead frames 4a and 4b and metal base plate 6 connected to the cooling units 9a and 9b for dissipating heat generated by the semiconductor elements 1a and 1b. An insulation layer 7 with high insulation performance (hereinafter occasionally referred to as a high-insulating insulation layer) is disposed on the opposite side of the metal base plate 6 from the high-heat-dissipation insulation layer 5. If necessary, the semiconductor elements 1a and 1b and lead frames 4a and 4b in the semiconductor device 30 are encapsulated with encapsulant 10 such as epoxy resin, silicone gel or elastomer.

Figure 5:
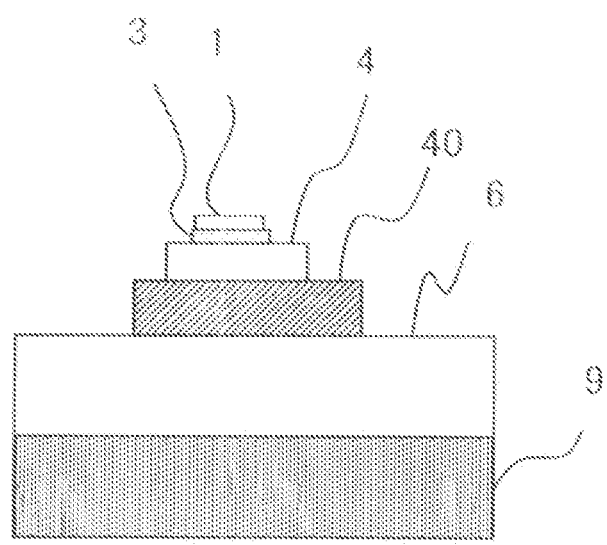
FIG. 5 is a cross-sectional view showing a semiconductor device of a comparative example.

The insulation layers 5 and 7 used in the semiconductor device 30 will be explained. Two functions are required for the insulation layers of the semiconductor device: insulation performance and heat-dissipation performance. In the semiconductor device of Patent document 1, the ceramic insulation substrate corresponds to the foregoing insulation layers and the first external electrode corresponds to the foregoing lead frames. FIG. 5 shows a simplified view with the ceramic insulation substrate replaced with the foregoing insulation layers and the first external electrode replaced with the foregoing lead frames in the semiconductor device of Patent document 1. FIG. 5 is a view showing a semiconductor device of a comparative example. In FIG. 5, a cooling unit 9 is placed on the back of the metal base plate 6 where the unit is usually placed. In a case of the semiconductor device of the comparative example as shown in FIG. 5, which has only one insulation layer, the layer must be provided with the foregoing two functions in a compatible manner.

Figure 2:
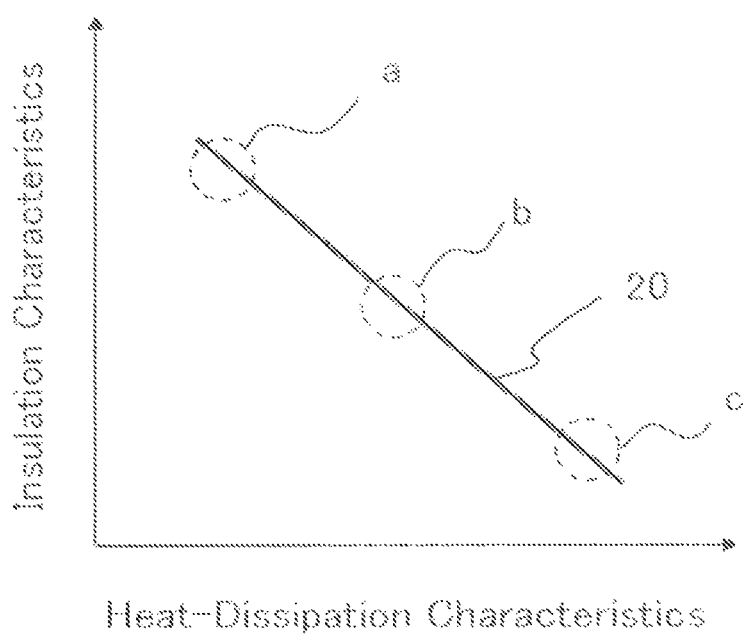
FIG. 2 is a correlation diagram showing the heat-dissipation characteristics and insulation characteristics of insulation layers according to Embodiment 1 of the present invention.

Now, insulation characteristics and heat-dissipation characteristics will be discussed. FIG. 2 is a correlation diagram showing the heat-dissipation characteristics and insulation characteristics of the insulation layers according to Embodiment 1 of the present invention. The horizontal axis represents the heat-dissipation characteristics and the vertical axis represents the insulation characteristics. As shown by the correlation characteristics 20 in FIG. 2, there is a correlation between the heat-dissipation characteristics and insulation characteristics. That is to say, the heat-dissipation characteristics and insulation characteristics correlate to each other in such a way that the higher either one of the characteristics is raised, the lower the other becomes. The semiconductor elements must be insulated from other elements etc. and operated within a temperature range enabling the elements to demonstrate their performance. In a semiconductor device mounted with semiconductor elements generating a large amount of heat by their operation and operating at high temperatures, the insulation performance and heat-dissipation performance need to be compatibly achieved in order for the elements to perform predetermined operation. In the semiconductor device of the comparative example in which the insulation performance and heat-dissipation performance need to be compatibly achieved by the one insulation layer, the characteristics of the insulation layer must be selected in the range indicated by the dotted-line circle b in FIG. 2.

Figure 3:
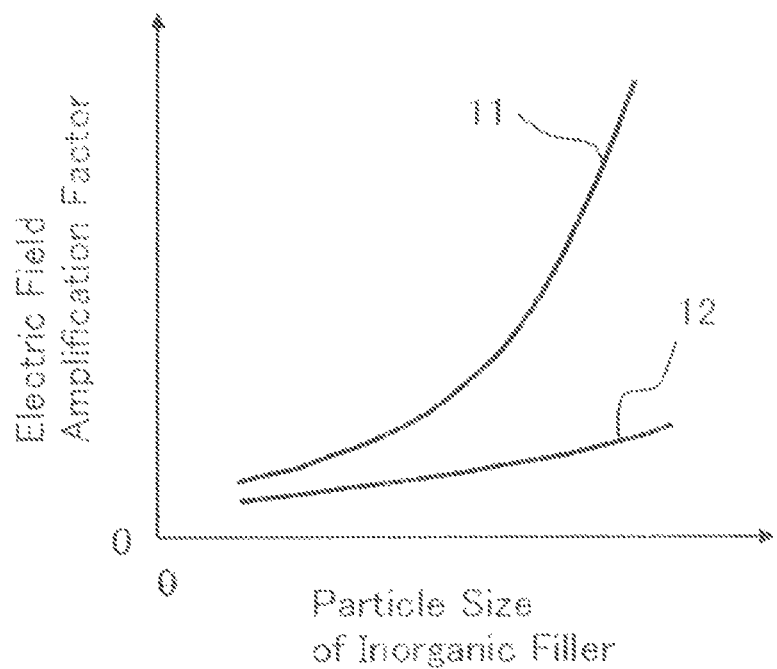
FIG. 3 is a view showing the electric field amplification factor of the insulation layers according to Embodiment 1 of the present invention.

In general, an organic insulation sheet is structured with thermosetting resin, such as epoxy resin, filled with inorganic fillers such as aluminum nitride, aluminum oxide (alumina), boron nitride and silicon carbide. In order to enhance the heat-dissipation performance, it is only necessary to enhance the thermal conductivity of insulation material by increasing the particle size and relative dielectric constant of the filler and its filling amount. However, when a first method to enhance the heat-dissipation performance, that is, increasing the filler particle size, is adopted, the larger the particle size increases, the higher the electric field amplification factor thereof (index of a local electric field in the proximity of inorganic filler divided by an average field) becomes as shown in FIG. 3, and as a result the insulation performance including withstand voltage characteristics and partial discharge resistance characteristics will be drastically deteriorated. FIG. 3 is a diagram showing the electric field amplification factor of the insulation layers according to Embodiment 1 of the present invention. The horizontal axis represents the particle size of the inorganic filler and the vertical axis represents the electric field amplification factor. The characteristics 11 represent characteristics when the relative dielectric constant of the inorganic filler is high, whereas the characteristics 12 represent those when the relative dielectric constant thereof is low.

Moreover, when a second method to enhance the heat-dissipation performance, that is, increasing the relative dielectric constant of the filler, is adopted, the characteristics 11 in which the relative dielectric constant of the inorganic filler, which is inorganic filling material, is increased demonstrate an electric field amplification factor higher than that of the characteristics 12, and as a result the insulation performance including withstand voltage characteristics and partial discharge resistance characteristics will be drastically deteriorated. The electric field amplification factor of the characteristics 11 in which the relative dielectric constant of the inorganic filler is increased becomes higher than that of the characteristics 12, the reason for which is that difference in the relative dielectric constant between the epoxy resin and filler becomes greater, thereby increasing the electric field at the filler tip.

Therefore, when the first and second methods to enhance the heat-dissipation performance are used together so as to further enhance the heat-dissipation performance, the electric field amplification factor is steeply increased as the right hand side of the characteristics 11 in FIG. 3, and the insulation performance is drastically deteriorated; therefore the insulation performance needed for operation of the semiconductor elements is difficult to maintain. Therefore, it is necessary to secure a predetermined insulation performance by decreasing the relative dielectric constant of the inorganic filler (making the constant close to the relative dielectric constant of the epoxy resin) and the electric field amplification factor as indicated by the characteristics 12.

Figure 4:
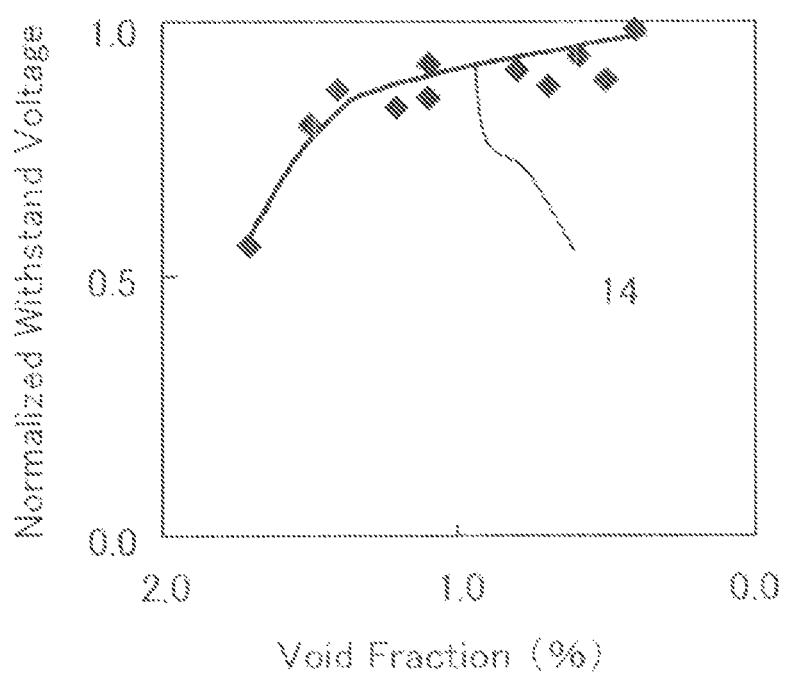
FIG. 4 is a correlation diagram showing a relation between the void fraction and insulation voltage of the insulation layers.

Moreover, when a third method to enhance the heat-dissipation performance, that is, increasing the amount of filler filled into the epoxy resin, is adopted, a void content rate per unit volume (referred to as a void fraction) will be increased. FIG. 4 is a correlation diagram showing the relation between the void fraction per unit volume in the insulation sheet (insulation layer) and the insulation voltage thereof when the epoxy resin is filled with the inorganic filler. The horizontal axis represents the void fraction and the vertical axis represents normalized withstand voltage. The normalized withstand voltage can be expressed, for example, using the ratio of insulation voltage at a certain void fraction. In FIG. 4, the withstand voltage is normalized using as the reference the insulation voltage at a void fraction of 0.4%. Since the larger the amount of filler is increased, the greater the void fraction becomes, the insulation performance including the withstand voltage characteristics and partial discharge resistance characteristics in this case will be drastically deteriorated as indicated by the characteristics 14 in FIG. 4.

Furthermore, it is also conceivable to thin the insulation layer to decrease its heat resistance, thereby increasing the heat-dissipation performance. However, if the heat resistance is decreased by thinning the insulation layer, so as to enhance the heat-dissipation performance, the electric field between the front and back faces of the insulation layer becomes higher; therefore, the insulation performance including the withstand voltage characteristics and partial discharge resistance characteristics will be deteriorated as with the cases of the first through third methods to enhance the heat-dissipation performance.

As described above, in the case of the semiconductor device of the comparative example that is provided with only one insulation layer, the shape and content rate of filler, the type of filler and the thickness of the insulation layer must be strictly chosen, which will narrow flexibilities in use of applicable materials and structural design. Even when semiconductor elements capable of operating at high temperatures (semiconductor elements for high-temperature applications) are mounted, the semiconductor device mounted with those elements is likely to be unable to achieve sufficient insulation performance and heat-dissipation performance. Therefore, when mounted with semiconductor elements generating a large amount of heat by their operation and operating at high temperatures, the semiconductor device of the comparative example provided with only one insulation layer cannot sufficiently enhance the insulation performance and heat-dissipation performance.

The semiconductor device 30 according to Embodiment 1, differing from the semiconductor device of the comparative example, is provided with insulation layers divided into two instead of one insulation layer; therefore the characteristics of the insulation layers can be optimized depending on applications. A material with high heat-dissipation performance as indicated by the dotted-line circle c in FIG. 2 is applied to the high-heat-dissipation insulation layer 5 that needs to efficiently transmit to the metal base plate 6 heat generated by the semiconductor elements 1a and 1b. Furthermore, another material with high insulation performance as indicated by the dotted-line circle a in FIG. 2 is applied to the high-insulating insulation layer 7 that does not need heat-dissipation characteristics at all or does not need so much but needs insulation to the exterior. Therefore, the semiconductor device 30 according to Embodiment 1 includes the high-heat-dissipation insulation layer 5 interposed between the metal base plate 6 and lead frames 4a and 4b, and the high-insulating insulation layer 7 disposed on the opposite side of the metal base plate 6 from the high-heat-dissipation insulation layer 5, whereby the heat-dissipation performance of the semiconductor device is enhanced and the insulation performance between the semiconductor device and exterior can also be enhanced.

The high-heat-dissipation insulation layer 5 can use material with a larger filler shape (particle size) and higher relative dielectric constant as shown in FIG. 3, and its filling amount can also be increased. Moreover, since the insulation performance of the high-heat-dissipation insulation layer 5 may be low, the layer can be thinned, so its heat transmission can also be enhanced by decreasing the heat resistance. However, it goes without saying when a plurality of semiconductor elements is arranged, withstand voltage exceeding driving voltage for each semiconductor element is needed.

Since the high-insulating insulation layer 7 no longer needs thermal conductivity, the epoxy resin does not need to be filled with filler. When the epoxy resin is not filled with filler, electric field concentration and void generation by the filler that would cause insulation failure can be prevented. Since the insulation voltage is increased as shown in FIG. 4, the high-insulating insulation layer 7 only has to have a thickness to secure necessary insulation voltage. That is, the thickness of the high-insulating insulation layer 7 can be reduced. Therefore as a result, thinning of the high-insulating insulation layer 7 will also become possible.

The characteristics of the high-heat-dissipation insulation layer 5 and high-insulating insulation layer 7 can also be made as follows: as to the heat-dissipation characteristics, the high-heat-dissipation insulation layer 5 is made greater than the high-insulating insulation layer 7; as to the insulation characteristics, the high-heat-dissipation insulation layer 5 is made smaller than the high-insulating insulation layer 7. If expressed using symbols > and <, the heat-dissipation characteristics of the high-heat-dissipation insulation layer 5>the heat-dissipation characteristics of the high-insulating insulation layer 7, and the insulation characteristics of the high-heat-dissipation insulation layer 5<the insulation characteristics of the high-insulating insulation layer 7 (condition 1). According to a configuration relevant to the condition 1, the shape and content rate of filler, the type of filler, the thickness of the insulation layer, etc. can be given wider margins; therefore a semiconductor device provided with high insulation reliability as well as high thermal conductivity can be obtained, while securing greater flexibilities in use of applicable materials and structure design.

Moreover, the high-insulating insulation layer 7 does not need high heat-dissipation performance, so instead of using an expensive substrate such as a thickened ceramic substrate as in Patent Document 1, inexpensive film-forming methods with high insulation reliability, such as powder coating and electrodeposition coating, can be adopted, which have never been applied to conventional semiconductor devices. Film-forming methods, such as powder coating and electrodeposition coating, are applied to the high-insulating insulation layer 7 whereby an insulation film made of polyimide, polyamide, epoxy resin, etc. can be directory formed on the metal base plate. As shown in FIG. 1, the metal base plate 6 and cooling units 9a and 9b can also be powder-coated or electrodeposition-coated by applying thereto these film-forming methods so that the high-insulating insulation layer 7 is provided on the faces of the cooling units 9a and 9b on the same side as the metal base plate 6 face on which the high-insulating insulation layer 7 is disposed. In the semiconductor device 30 according to Embodiment 1, the problem of high cost caused by using the thickened ceramic substrate in the semiconductor device of Patent document 1 can be solved. Additionally, the high-insulating insulation layer 7 formed on the cooling units 9a and 9b may cover only a part thereof where insulation is required.

Furthermore, the metal base plate 6 can also be made ungrounded in the semiconductor device 30 according to Embodiment 1. That is, the metal base plate 6 can be disconnected from a ground-potential electrode (not shown) that gives a ground potential to the semiconductor elements 1a and 1b. Noise to the semiconductor elements 1a and 1b can be suppressed by making the metal base plate 6 ungrounded.

Therefore, a semiconductor device can be obtained in which stable operation of the semiconductor elements 1a and 1b is secured.

The semiconductor device according to Embodiment 1 comprises: the semiconductor element 1a; the lead frame 4a connected to the semiconductor element 1a; the metal base plate 6 mounted on the lead frame 4a via the first insulation layer 5; and the second insulation layer 7 disposed on the opposite side of the metal base plate 6 face on which the first insulation layer 5 is disposed. The characteristics of the first insulation layer 5 and the second insulation layer 7 are either of the following: the first insulation layer 5 is an insulation layer whose heat-dissipation performance is higher than that of the second insulation layer 7, and the second insulation layer 7 is an insulation layer whose insulation performance is the same as that of the first insulation layer 5 or higher than that of the first insulation layer 5; and the second insulation layer 7 is an insulation layer whose insulation performance is higher than that of the first insulation layer 5, and the first insulation layer 5 is an insulation layer whose heat-dissipation performance is the same as that of the second insulation layer 7 or higher than that of the second insulation layer 7; therefore both the insulation performance and heat-dissipation performance can be enhanced.

By the way, the number of semiconductor elements is made two in Embodiment 1 for the sake of easy understanding; however it may be changed to any number to better suit for applications. Moreover, an example is illustrated using wiring as a means for electrical connection; however it goes without saying the same effect as that on Embodiment 1 can be produced, even if spherical electrodes, interposers, printed wiring boards or direct lead methods are used as the means for electrical connection. Furthermore, a transfer-mold-type semiconductor device has been explained as an example; however, this can be applied to semiconductor devices using different manufacturing methods, such as a casing-type semiconductor device attached to its casing as with the semiconductor device of Patent Document 1, which can of course produce the same effect.

Moreover, both of heatsink-integrated-type and heatsink-separate-type semiconductor devices can be configured the same as Embodiment 1, and in which the same effect as that on Embodiment 1 can be produced. Furthermore, the same effect can be produced on all of the semiconductor elements including not only semiconductor elements made of silicon (Si) but also compound-semiconductor elements made of silicon carbide (SiC), gallium nitride, etc. It goes without saying the same effect can also be produced on diodes (Di), transistors other than IGBTs, integrated circuits (IC), etc.

Particularly, semiconductor elements for high-temperature applications can use gallium-nitride-based material and diamond other than silicon carbide. When the silicon carbide, gallium-nitride-based material or diamond is used for semiconductor elements functioning as switching elements and rectifying elements, power loss in those elements is low compared to conventionally-used elements made of silicon (Si), which therefore enables a semiconductor device for high-temperature applications, such as a power semiconductor device, to operate with high efficiency. In addition, since the elements are provided with not only high withstand voltage but also high allowable current density, the semiconductor device can be miniaturized. In addition, since wide-bandgap semiconductor elements are provided with high heat resistance, the elements can be operated at high temperatures, which enables reduction in size of radiation fins of heatsinks and also change of the cooling system from water cooling to air cooling, so that the semiconductor device can be further miniaturized.

Furthermore, the same structure as that of Embodiment 1 can be applied to any type of semiconductor devices, such as a junction type in which electrodes are electrically connected with semiconductor chips, an insulation substrate, etc. with solder and the like; a press-contact type in which electrodes are pressed to semiconductor chips, an insulation substrate, etc., inwardly from outside of the electrodes by elastic members, tightening bolts and the like, so as to electrically connect those with each other; and a combination type with these types combined together; therefore the same effect as that on Embodiment 1 can be produced. In addition, it goes without saying any type of inorganic fillers can be used other than the foregoing aluminum nitride, aluminum oxide (alumina), born nitride and silicon carbide, as long as the fillers satisfy a quantitative relationship between their relative dielectric constants.

DESCRIPTION OF THE REFERENCE NUMERALS 1, 1a, 1b: semiconductor element
4a, 4b: lead frame
5: high-heat-dissipation insulation layer (first insulation layer)
6: metal base plate
7: high-insulating insulation layer (second insulation layer)
9a, 9b: cooling unit
30: semiconductor device

The invention claimed is:
1. A semiconductor device, comprising:
a semiconductor element;
a lead frame connected to the semiconductor element;
a metal base plate mounted on the lead frame via a first insulation layer, a face of the metal base plate and the first insulation layer facing each other;
a second insulation layer disposed on a side of the metal base plate face opposite the first insulation layer; and
a cooling unit, directly connected to a side of the metal base plate, disposed on the second insulation layer on a side of the second insulation layer which faces the metal base plate, the side of the metal base plate being perpendicular to the face of the metal base plate.
2. A semiconductor device according to claim 1, wherein the first insulation layer is an insulation layer whose heat-dissipation performance is higher than that of the second insulation layer, and the second insulation layer is an insulation layer whose insulation performance is higher than that of the first insulation layer.

3. A semiconductor device according to claim 2, wherein the first insulation layer and the second insulation layer include filler, and a filler particle size of the first insulation layer is greater than that of the second insulation layer.

4. A semiconductor device according to claim 2, wherein the first insulation layer and the second insulation layer include filler, and a relative dielectric constant of filler of the first insulation layer is higher than that of filler of the second insulation layer.

5. A semiconductor device according to claim 2, wherein a void fraction, which is a void content rate per unit volume, of the first insulation layer is higher than that of the second insulation layer.

6. A semiconductor device according to claim 2, wherein the first insulation layer and the second insulation layer include filler, and a filling amount of filler of the first insulation layer is greater than that of filler of the second insulation layer.

7. A semiconductor device according to claim 2, wherein a thickness of the first insulation layer is smaller than that of the second insulation layer.

8. A semiconductor device according to claim 1, wherein the second insulation layer is formed by powder coating or electrodeposition coating.

9. A semiconductor device according to claim 1, wherein the metal base plate is not connected to a ground-potential electrode that supplies a ground potential to the semiconductor element.

10. A semiconductor device according to claim 1, wherein the semiconductor element includes wide-bandgap semiconductor material.

11. A semiconductor device according to claim 10, wherein the wide-bandgap semiconductor material is any one of silicon carbide, gallium-nitride-based material and diamond.

12. A semiconductor device according to claim 1, wherein:
the first insulation layer is an insulation layer whose heat-dissipation performance is higher than that of the second insulation layer, and the second insulation layer is an insulation layer whose insulation performance is same as that of the first insulation layer or higher than that of the first insulation layer.

13. A semiconductor device according to claim 1, wherein:
the second insulation layer is an insulation layer whose insulation performance is higher than that of the first insulation layer, and the first insulation layer is an insulation layer whose heat-dissipation performance is same as that of the second insulation layer or higher than that of the second insulation layer.

14. A semiconductor device according to claim 1, further comprising:
a second cooling unit, connected to the metal base plate, disposed on the second insulation layer on the side of the second insulation layer which faces the metal base plate, the second cooling unit disposed on an opposite side of said semiconductor element as said cooling unit.

* * * * *